(12) United States Patent
Koduri et al.

(10) Patent No.: US 11,476,175 B2
(45) Date of Patent: Oct. 18, 2022

(54) SENSOR PACKAGE CAVITIES WITH POLYMER FILMS

(71) Applicant: TEXAS INSTRUMENTS INCORPORATED, Dallas, TX (US)

(72) Inventors: Sreenivasan Kalyani Koduri, Allen, TX (US); Leslie Edward Stark, Heath, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 17/125,487

(22) Filed: Dec. 17, 2020

(65) Prior Publication Data
US 2022/0199479 A1 Jun. 23, 2022

(51) Int. Cl.
*H01L 21/56* (2006.01)
*H01L 23/31* (2006.01)
*H01L 23/29* (2006.01)

(52) U.S. Cl.
CPC ........ *H01L 23/3171* (2013.01); *H01L 23/293* (2013.01); *H01L 23/315* (2013.01)

(58) Field of Classification Search
CPC ........ G01D 11/245; H01L 23/31–3192; H01L 23/3171; H01L 21/565
See application file for complete search history.

(56) References Cited

U.S. PATENT DOCUMENTS

2022/0155109 A1\* 5/2022 Koduri ................. H01L 21/565

\* cited by examiner

*Primary Examiner* — Suberr L Chi
(74) *Attorney, Agent, or Firm* — Yudong Kim; Charles A. Brill; Frank D. Cimino

(57) ABSTRACT

In examples, a sensor package includes a semiconductor die, a sensor on the semiconductor die, and a mold compound covering the semiconductor die. The mold compound includes a sensor cavity over the sensor. The sensor package includes a polymer film member on the sensor and circumscribed by a wall of the mold compound forming the sensor cavity. The polymer film member is exposed to an exterior environment of the sensor package.

10 Claims, 11 Drawing Sheets

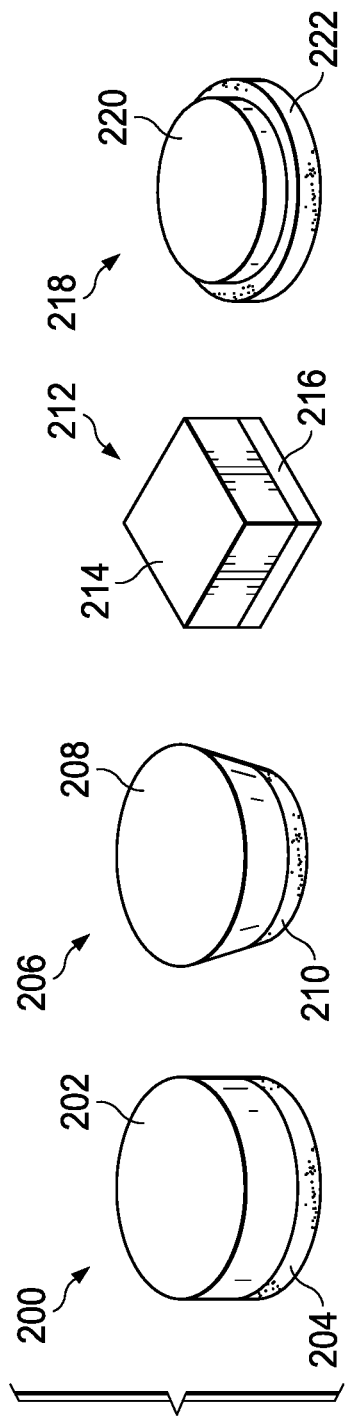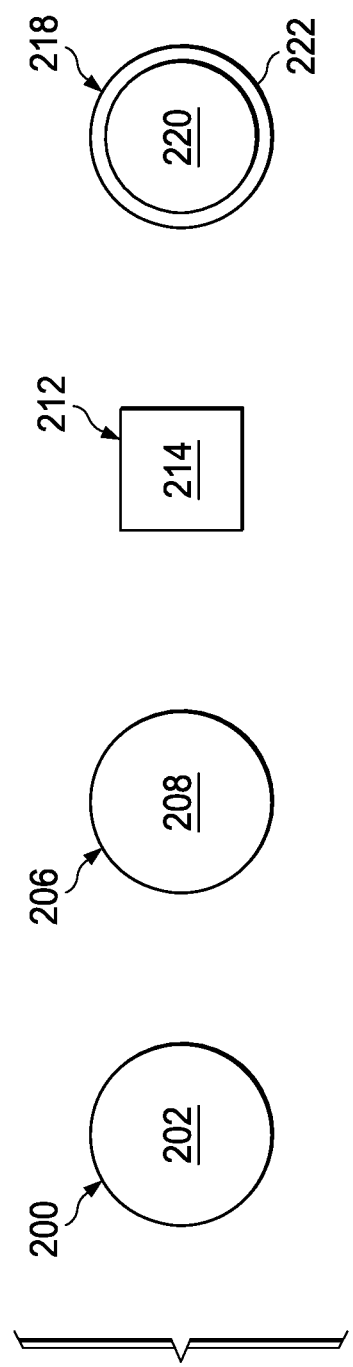

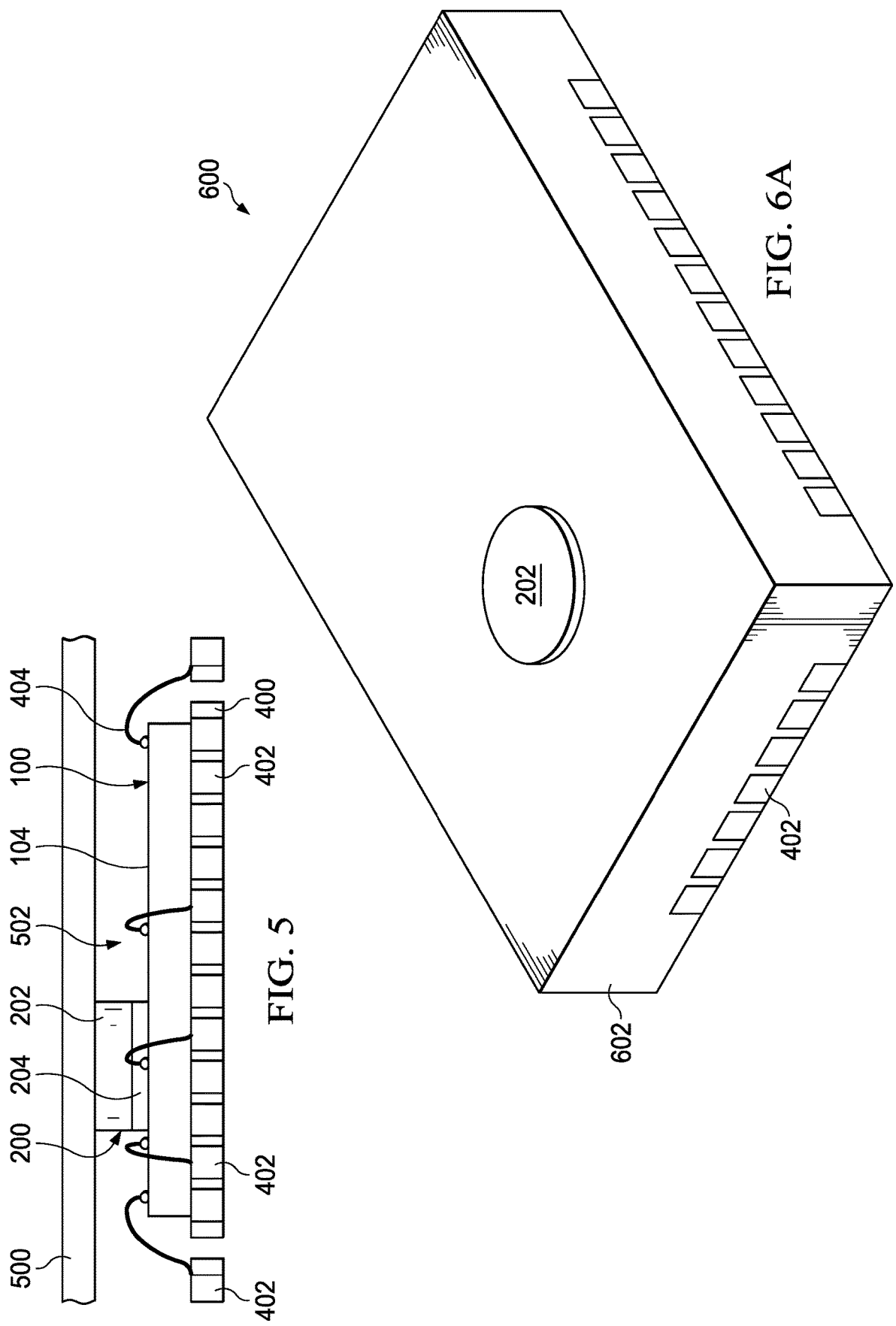

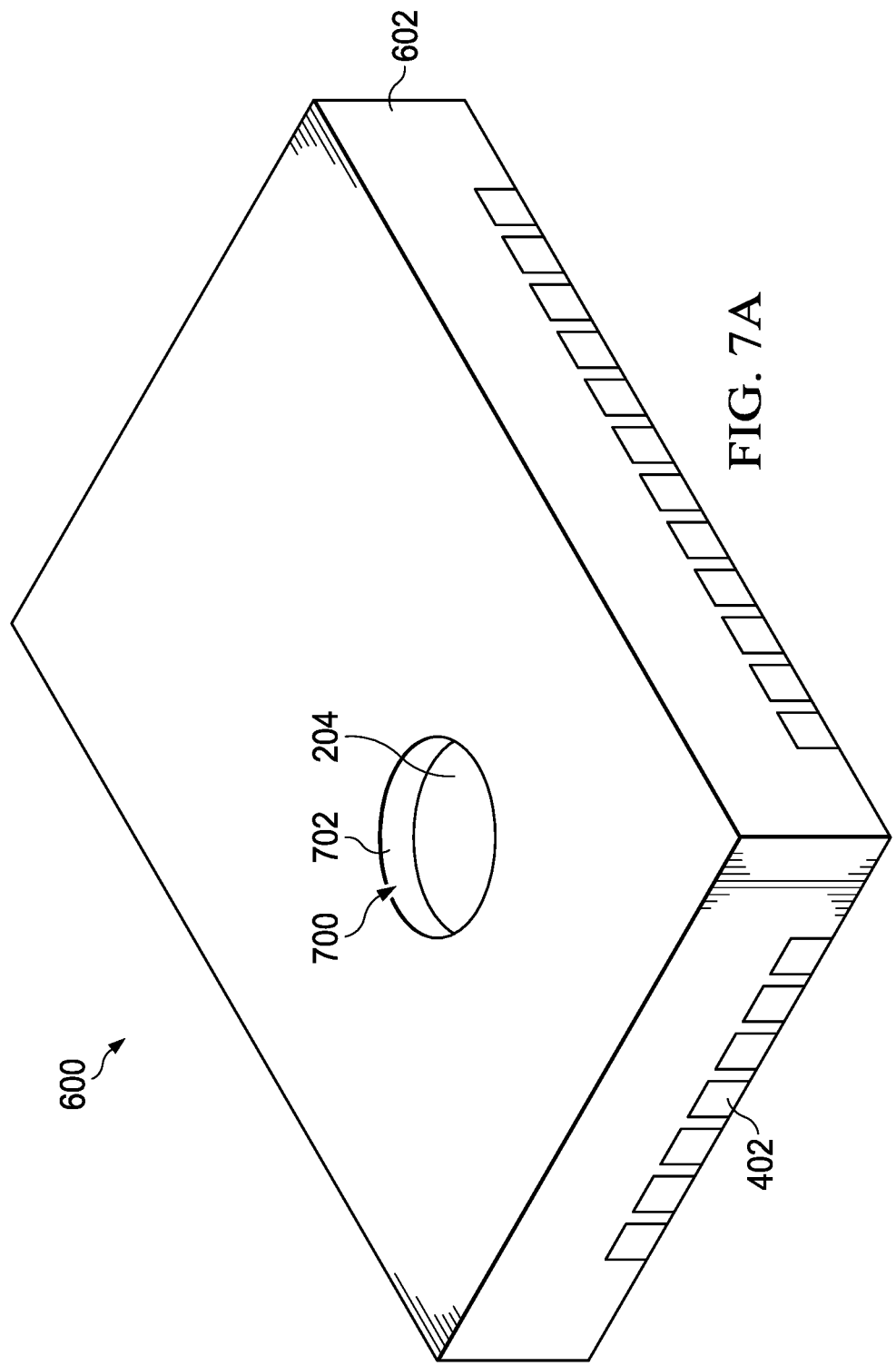

FIG. 8B

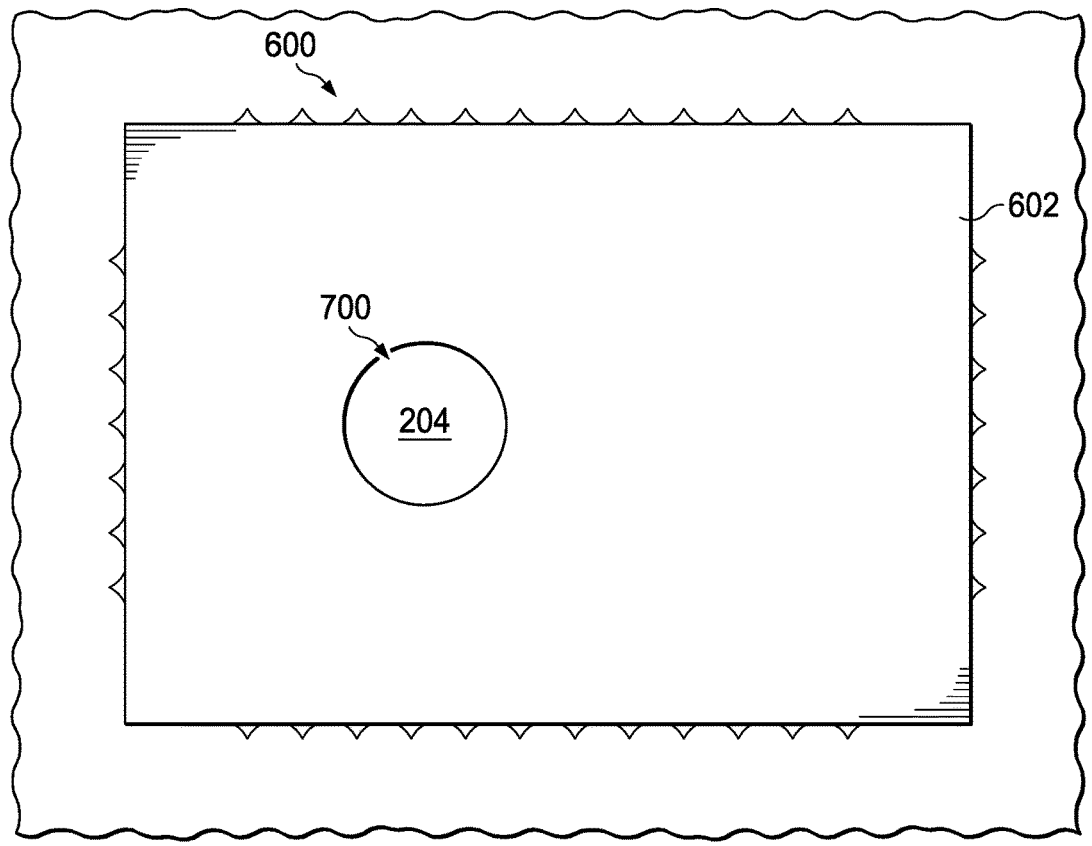

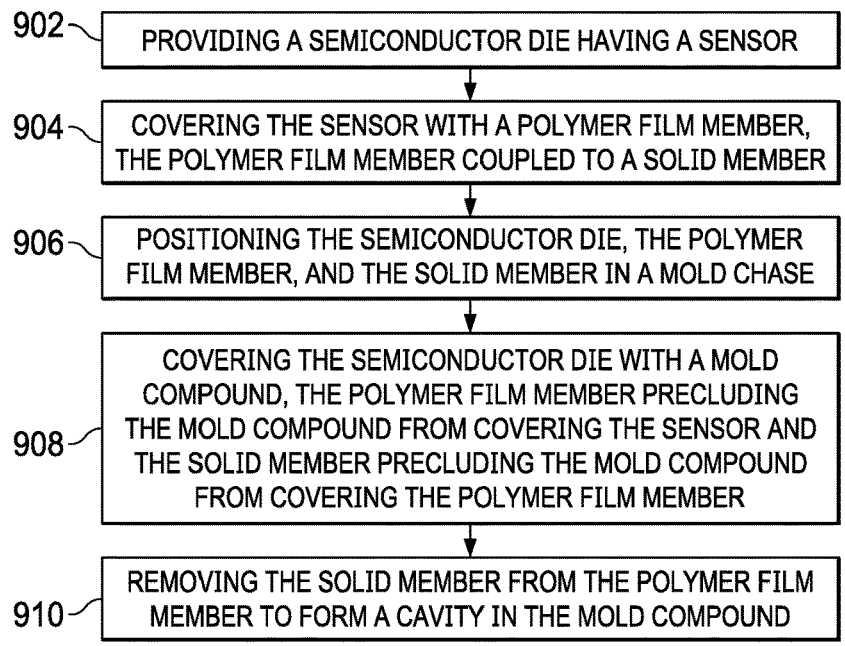

FIG. 9

902 — PROVIDING A SEMICONDUCTOR DIE HAVING A SENSOR

904 — COVERING THE SENSOR WITH A POLYMER FILM MEMBER, THE POLYMER FILM MEMBER COUPLED TO A SOLID MEMBER

906 — POSITIONING THE SEMICONDUCTOR DIE, THE POLYMER FILM MEMBER, AND THE SOLID MEMBER IN A MOLD CHASE

908 — COVERING THE SEMICONDUCTOR DIE WITH A MOLD COMPOUND, THE POLYMER FILM MEMBER PRECLUDING THE MOLD COMPOUND FROM COVERING THE SENSOR AND THE SOLID MEMBER PRECLUDING THE MOLD COMPOUND FROM COVERING THE POLYMER FILM MEMBER

910 — REMOVING THE SOLID MEMBER FROM THE POLYMER FILM MEMBER TO FORM A CAVITY IN THE MOLD COMPOUND

SENSOR PACKAGE CAVITIES WITH POLYMER FILMS

BACKGROUND

Electrical circuits are formed on semiconductor dies and subsequently packaged inside mold compounds to protect the circuits from damage due to elements external to the package, such as moisture, heat, and blunt force. To facilitate communication with electronics external to the package, an electrical circuit within the package is electrically coupled to conductive terminals. These conductive terminals are positioned inside the package but are exposed to one or more external surfaces of the package. By coupling the conductive terminals to electronics external to the package, a pathway is formed to exchange electrical signals between the electrical circuit within the package and the electronics external to the package via the conductive terminals.

SUMMARY

In examples, a sensor package comprises a semiconductor die, a sensor on the semiconductor die, and a mold compound covering the semiconductor die. The mold compound includes a sensor cavity over the sensor. The sensor package includes a polymer film member on the sensor and circumscribed by a wall of the mold compound forming the sensor cavity. The polymer film member is exposed to an exterior environment of the sensor package.

In examples, a method comprises covering a sensor of a semiconductor die with a polymer film member. The polymer film member couples to a solid member. The method comprises positioning the semiconductor die, the polymer film member, and the solid member in a mold chase. The method comprises covering the semiconductor die with a mold compound, the polymer film member precluding the mold compound from covering the sensor and the solid member precluding the mold compound from covering the polymer film member. The method comprises removing the solid member from the polymer film member to form a sensor cavity in the mold compound.

BRIEF DESCRIPTION OF THE DRAWINGS

For a detailed description of various examples, reference will now be made to the accompanying drawings in which:

FIGS. 1A, 1B, 2A, 2B, 3A, 3B, 4A, 4B, 5, 6A, 6B, 6C, 7A, 7B, 7C, 8A, and 8B are profile, top-down, and perspective view process flow diagrams illustrating the manufacture of a sensor package having sensor cavities with polymer films, in accordance with various examples.

FIG. 9 is a flow diagram of a method for manufacturing a sensor package having sensor cavities with polymer films, in accordance with various examples.

DETAILED DESCRIPTION

Figure 1A:
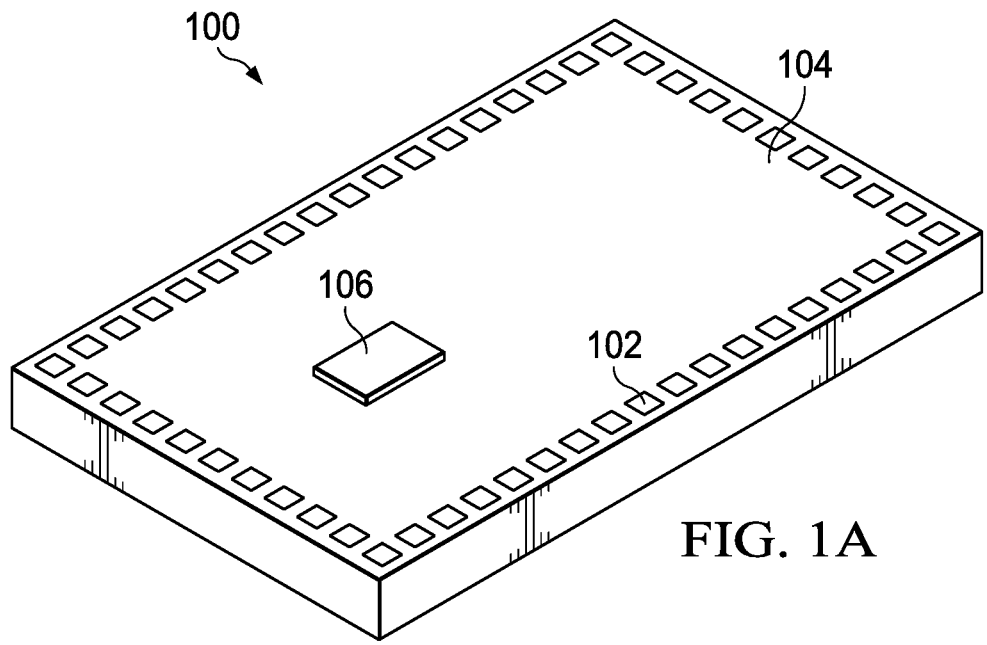

Some types of packages are configured to measure various physical properties of an environment, such as temperature, humidity, light, sound, pressure, etc. In many instances, the package includes a sensor that is exposed to the environment to be tested. Thus, for example, a package that is configured to measure the temperature of a swimming pool may be positioned in an area of the pool where the sensor will be exposed to the pool water. Such packages are referred to herein as sensor packages.

Sensor packages contain sensors, but they also contain other circuitry, such as an analog front-end (AFE) circuit, to process the properties of the environment sensed by the sensor. This circuitry cannot be exposed to the environment, as doing so could damage the circuitry and render it inoperable. Accordingly, sensor packages are fabricated so that the sensor is exposed to the environment, but the remaining circuitry of the package is covered by the mold compound of the package. A sensor package may include a sensor cavity in its mold compound, and the sensor is positioned inside this sensor cavity.

Contemporary designs for sensor packages are unsatisfactory for multiple reasons, most of which are due to inefficiencies in the manufacturing process, and specifically due to inefficiencies in creating the sensor cavities mentioned above. For example, sensor cavities are created using complex and expensive molding equipment that is limited in its ability to create small sensor cavities. Each sensor cavity formed by this equipment must be of a minimum threshold size. This inability to create small sensor cavities limits each sensor package to a single sensor cavity, and, thus, to a single sensor. While this challenge could theoretically be mitigated by increasing package size, such increases are highly undesirable, and most or all industries and customers demand decreasing package size instead of increasing package size. Furthermore, not only are sensor packages limited to a single sensor cavity and a single sensor, but sensor packages must be of a minimum threshold size so that even one sensor cavity can be accommodated. Thus, these sensor packages with only one sensor cannot be further decreased in size.

In some applications, a polymer film is deposited on the semiconductor die of the sensor package, including on the sensor itself. The polymer film interacts with various elements in the environment, such as moisture, gas, pressure, etc. Such interactions cause changes in the properties of the polymer film. The sensor may detect such changes, and circuitry coupled to the sensor interprets such changes to determine measurements of the element(s) applied to the polymer film. For example, exposure to a particular gas may cause the polymer film conductance to change, and this change may be detected and interpreted by the sensor package to determine one or more properties of the gas. These polymer films come with challenges. For example, the polymer film is typically applied to most or all of the active surface of the semiconductor die in the sensor package, because reducing the area to which the polymer film is applied necessitates the use of special types of polymer films (e.g., photosensitive polymer films) that can be expensive or restrictive, and it further entails the use of tedious, expensive, and time-consuming photo processing steps. Thus, the polymer film is generally applied to all but the scribe streets of the wafer and bond pads of the semiconductor dies, but removing the polymer film from even these areas still entails the use of photosensitive polymer films and photo processing techniques.

This disclosure describes various examples of a sensor package and examples of techniques for manufacturing such a sensor package that overcome the challenges described above. Specifically, in contrast to prior techniques for forming sensor cavities and polymer films in sensor packages, some of the examples described below entail the use of components and techniques that result in miniature sensor cavities, which facilitates the reduction of sensor packages sizes and/or the incorporation of multiple sensor cavities and sensors in a single sensor package without increasing package size. In addition, some of the examples described below produce sensor cavities that contain polymer films, and these polymer films are fully contained within the sensor cavities without the use of photosensitive polymer films or photo processing techniques. Thus, restrictive, expensive, tedious, and time-consuming materials and processes relating to the polymer films are omitted. At the same time, the benefits of the polymer films, such as protection of the sensor, properties as a sensing component, and service as a stress buffer are maintained. At least some such examples include providing a semiconductor die having a sensor; covering the sensor with a polymer film member, the polymer film member coupled to a solid member; and positioning the semiconductor die, the polymer film member, and the solid member in a mold chase. Such examples further include covering the semiconductor die with a mold compound, the polymer film member precluding the mold compound from covering the sensor and the solid member precluding the mold compound from covering the polymer film member. Such examples also include removing the solid member from the polymer film member to form a sensor cavity in the mold compound. These and other examples are now described with reference to the drawings.

FIGS. 1A-8B are profile, top-down, and perspective view process flow diagrams illustrating the manufacture of a sensor package having sensor cavities with polymer films, in accordance with various examples. FIG. 9 is a flow diagram of a method 900 for manufacturing a sensor package having sensor cavities with polymer films, in accordance with various examples. Accordingly, FIGS. 1A-8B are now described in parallel with the method 900 of FIG. 9.

Figure 1B:
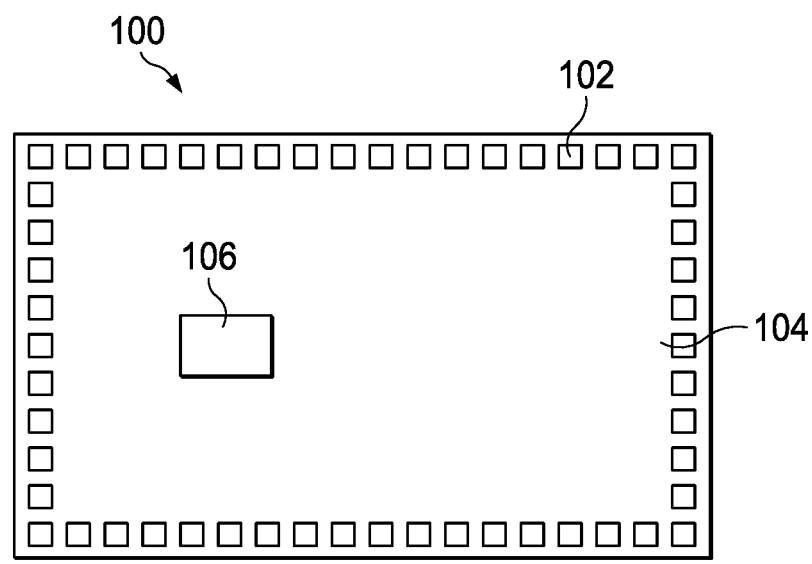

The method 900 includes providing a semiconductor die having a sensor (902). FIG. 1A is a perspective view of a semiconductor die 100. In some examples, the semiconductor die 100 is part of a semiconductor wafer, and in other examples, the semiconductor die 100 has been singulated from a semiconductor wafer. The semiconductor die 100 may comprise silicon or any other suitable semiconductor. The semiconductor die 100 includes multiple bond pads 102 and an active surface 104 on and/or in which circuitry (e.g., an integrated circuit) is formed. The circuitry is not expressly shown, but such circuitry couples to the bond pads 102 (e.g., via metal traces). The active surface 104 also includes a sensor 106. The sensor 106 may be any suitable type of sensor, for example, a sensor for sensing gas, moisture, pressure, electricity, sound, temperature, or any other suitable property. The sensor 106 may couple to the circuitry on the active surface 104. The sensor 106 may sense properties in the ambient environment and communicate signals encoding the sensed properties to the circuitry on the active surface 104. FIG. 1B is a top-down view of the structure of FIG. 1A.

The method 900 comprises covering the sensor with a polymer film member, the polymer film member coupled to a solid member (904). Although the examples described herein assume the use of a polymer film member, the scope of this disclosure is not limited to polymer film members. Any suitable material may be used in lieu of a polymer film member. FIG. 2A provides perspective views of multiple studs 200, 206, 212, 218, each of the studs including a polymer film member (which, as explained below, is used to cover the sensor 106) and a solid member. A solid member, as used herein, refers to a rigid component that has a compressibility of less than 1% (e.g., metal, such as copper, nickel, aluminum, steel, or a metal alloy). The term compressibility, as used herein, refers to the degree to which a component may be compressed (e.g., a component having a thickness of 100 microns that has a compressibility of 1% may be compressed by 1 micron down to a compressed thickness of 99 microns). For example, the stud 200 includes a polymer film member 204 and a solid member 202. For example, the stud 206 includes a polymer film member 210 and a solid member 208. For example, the stud 212 includes a polymer film member 216 and a solid member 214. For example, the stud 218 includes a polymer film member 222 and a solid member 220. As explained in detail below, studs are positioned on the sensor 106 prior to a molding process. When a mold compound is applied, the stud prevents the mold compound from covering the sensor 106 and from occupying any space above the sensor 106. After the molding process, the solid member is removed, for example, by an etching process, thereby producing a sensor package having a sensor cavity in the mold compound and with the polymer film member in the sensor cavity, covering the sensor.

Each of the polymer film members 204, 210, 216, 222 may comprise any suitable type of material, such as B-stage polymers, polyimide, benzocyclobutene, polybenzoxazoles, polypyrrole, polyaniline, polythiophene, and poly(3,4-ethylenedioxythophene). In some examples, the polymer film members are non-photosensitive, meaning that they are not vulnerable to photolithography techniques. The inclusion of non-photosensitive polymer film members is made possible at least in part by the use of the studs 200, 206, 212, 218 that include the polymer film members 204, 210, 216, 222. By including these polymer film members as parts of the studs, the polymer film members are positioned on the sensors and in the sensor cavities as the sensor cavities are being created, thus mitigating any need to use expensive and tedious photo processing techniques and obviating any need to use polymer films that cover most or all of the active surface 104.

In examples, these polymer film members 204, 210, 216, 222 have thicknesses ranging from 5 microns to 100 microns. Thicker polymer film members may be advantageous because, for example, they may provide enhanced protection for the sensor 106. Thinner polymer film members may be advantageous because, for example, they provide a slimmer profile for the semiconductor die 100. In some examples, each of these polymer film members has a compressibility ranging from 10% to 50% of its uncompressed thickness (e.g., a member having a thickness of 100 microns that has a compressibility of 10% may be compressed by 10 microns down to a compressed thickness of 90 microns). In some examples, the polymer film members have a minimum compressibility of 5%, as a compressibility of less than 5% may be insufficient to enable the mold chase to close properly and may necessitate the use of additional film(s) in the mold chase to prevent undesirable mold compound flow patterns. As explained below, greater compressibility mitigates any need for additional film(s) to be used during the molding process. Conversely, lesser compressibility mitigates the risk of damage (e.g., by physical trauma) to the sensor 106. Thicknesses of the polymer film members may be adjusted depending on the compressibility of the polymer film members. More compressible polymer film members potentially risk damage to the sensor 106 and thus may be thicker, while less compressible film members may pose less of a damage risk to the sensor 106 and thus may be thinner.

The studs 200, 206, 212, 218 may be manufactured separately from the semiconductor die 100 and/or from the sensor packages described herein. For example, the polymer film members 204, 210, 216, 222 and the solid members 202, 208, 214, 220 may be punched, chemically etched, laser cut, stamped, cast, or otherwise formed from sheets of polymer film and/or metal. A polymer film member may be coupled to a solid member using a suitable adhesive, such as tape or epoxy. In other examples, a polymer film may be adhered to (e.g., coated) a sheet of metal, and punching, chemical etching, laser cutting, stamping, or casting operations may then be used to form studs of suitable size and shape.

As shown in FIG. 2A, the resulting stud may have any of a variety of shapes and sizes. For example, the solid member 202 and the polymer film member 204 have identical diameters. For example, the solid member 202 and the polymer film member 204 have different thicknesses, with the polymer film member 204 being thinner than the solid member 202. In other examples, the polymer film member 204 may be thicker than the solid member 202, which may provide greater protection for the sensor 106. In examples, the solid member 208 is wedge-shaped, with the diameter of the solid member 208 being greater at a top surface of the solid member 208 than at a bottom surface of the solid member 208. Such a wedge shape facilitates removal of the solid member 208 after a mold compound has been applied. The polymer film member 210 is thinner than the solid member 208, but the scope of disclosure includes examples in which the polymer film member 210 is thicker than the solid member 208.

The horizontal cross-sections of the studs 200, 206 are circular. In some examples, other horizontal cross-sectional shapes may be used. For example, the stud 212 has a rectangular horizontal cross-section. In other examples, an elliptical cross section may be used. In examples, rectangles or other polygons with rounded corners may be used. Although the polymer film member 216 is depicted as being thinner than the solid member 214, in some examples, the polymer film member 216 is thicker than the solid member 214.

The studs 200, 206, 212 have horizontal polymer film member areas that are no larger than the horizontal areas of their respective solid members (e.g., same diameter in the case of a circular horizontal cross-section, or same horizontal length and width in the case of a rectangular horizontal cross-section). However, in some examples, the area of the polymer film member and the solid member may differ. The polymer film member 222 and the solid member 220 of the stud 218 have differing horizontal areas, for example. As shown, the polymer film member 222 has a larger diameter than the solid member 220. For example, the polymer film member 222 diameter may exceed a diameter of the solid member 220 by a value between 0.1 millimeters and 2 millimeters. This may be advantageous, for example, when the solid member 220 is etched away after mold compound application, leaving the polymer film member 222 in the resulting sensor cavity of the mold compound. In this case, the polymer film member 222 will have a diameter that is larger than that of the sensor cavity (e.g., by a value between 0.1 millimeters and 2 millimeters) and thus will be locked in place at the bottom of the sensor cavity by the mold compound, thus mitigating the likelihood that the polymer film member 222 could detach from the sensor 106 and fall out of the sensor cavity. A differential greater than this 0.1 mm-2 mm range may still mitigate the risk of detachment but may result in absolute dimensions of the polymer film member 222 and/or the solid member 220 that are unacceptable for structural or functional reasons. For example, the polymer film member 222 may become so large that it interferes with the wirebonding process on adjacent bond pads 102. For example, the solid member 220 may become so small that when the solid member 220 is later removed, the resulting sensor cavity may be unacceptably small. Conversely, a differential smaller than the 0.1 mm-2 mm range may not adequately mitigate against the risk of the detachment described above. In both examples where the polymer film member has the same diameter as the sensor cavity (e.g., as would occur with use of the stud 200) and where the polymer film member has a larger diameter than the sensor cavity (e.g., as would occur with use of the stud 218), the stud may be coupled to the sensor 106 using an adhesive, such as epoxy or tape. In the case of a B-stage polymer film member, adhesives may be omitted. FIG. 2B shows top-down views of the studs 200, 206, 212, 218.

Figure 3A:
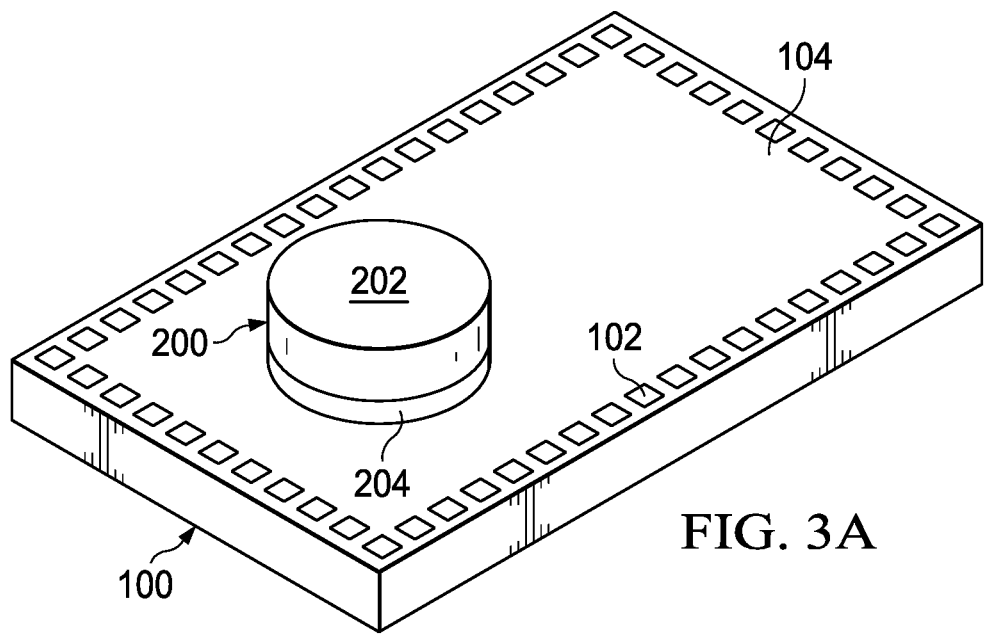
Figure 3B:
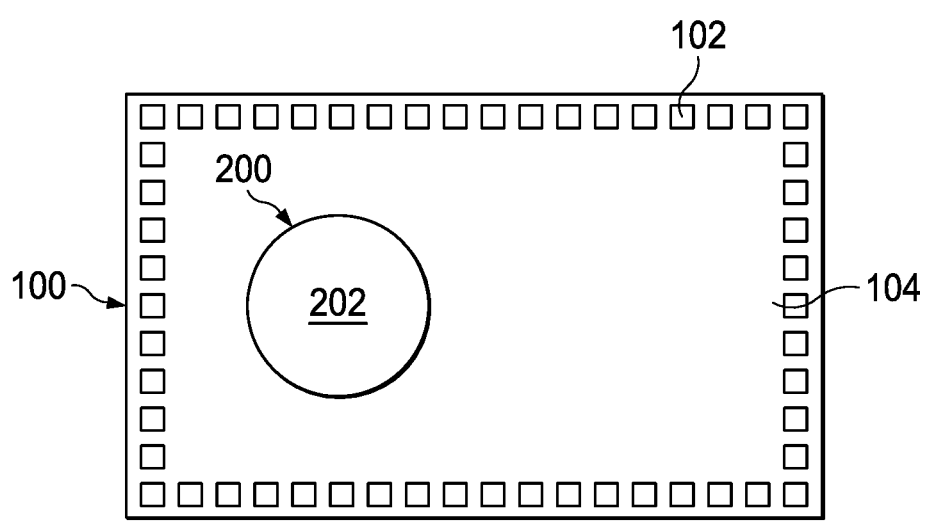

FIG. 3A is a perspective view of the semiconductor die 100 having a stud, such as stud 200, positioned on the sensor 106. The stud 200, and more specifically, the polymer film member 204, may couple to the sensor 106 using a suitable adhesive, such as epoxy, tape, resin, polyimide, etc. Other adhesives are contemplated and included in the scope of this disclosure. In some examples, for instance in examples where the polymer film member 204 is a B-stage polymer film, an adhesive may be omitted. FIG. 3B is a top-down view of the structure of FIG. 3A.

Figure 4A:
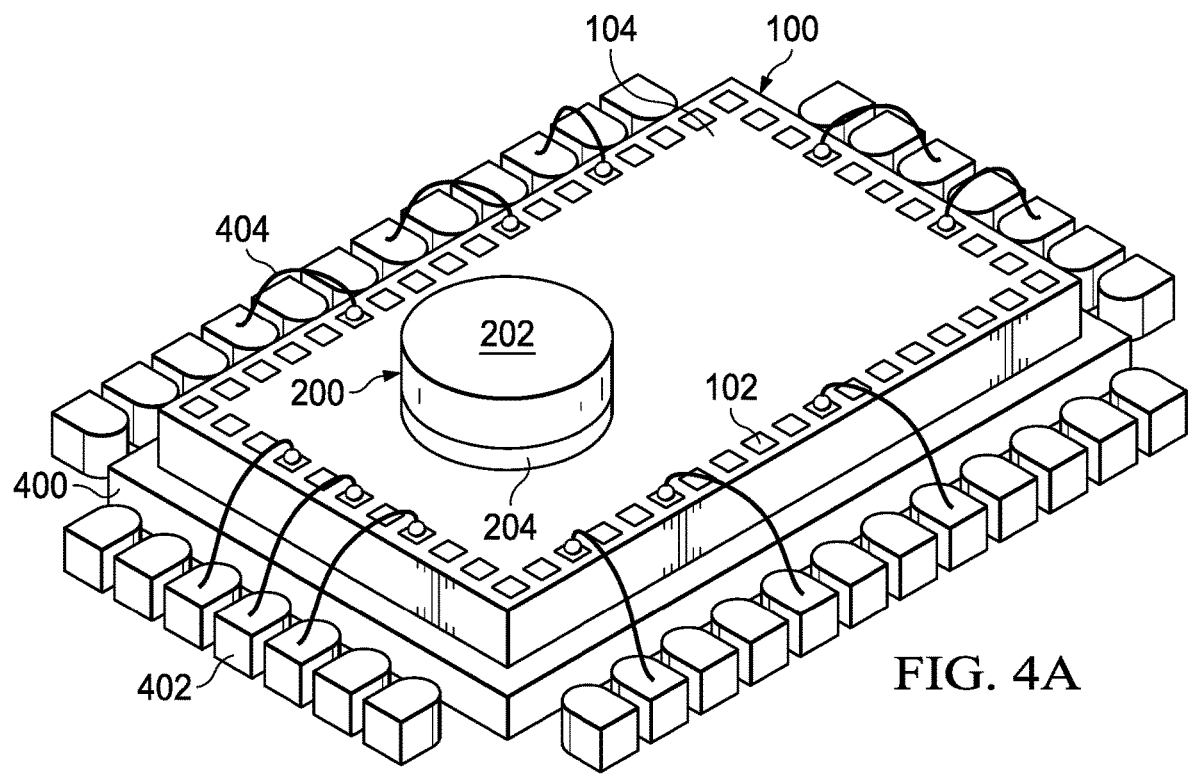
Figure 4B:
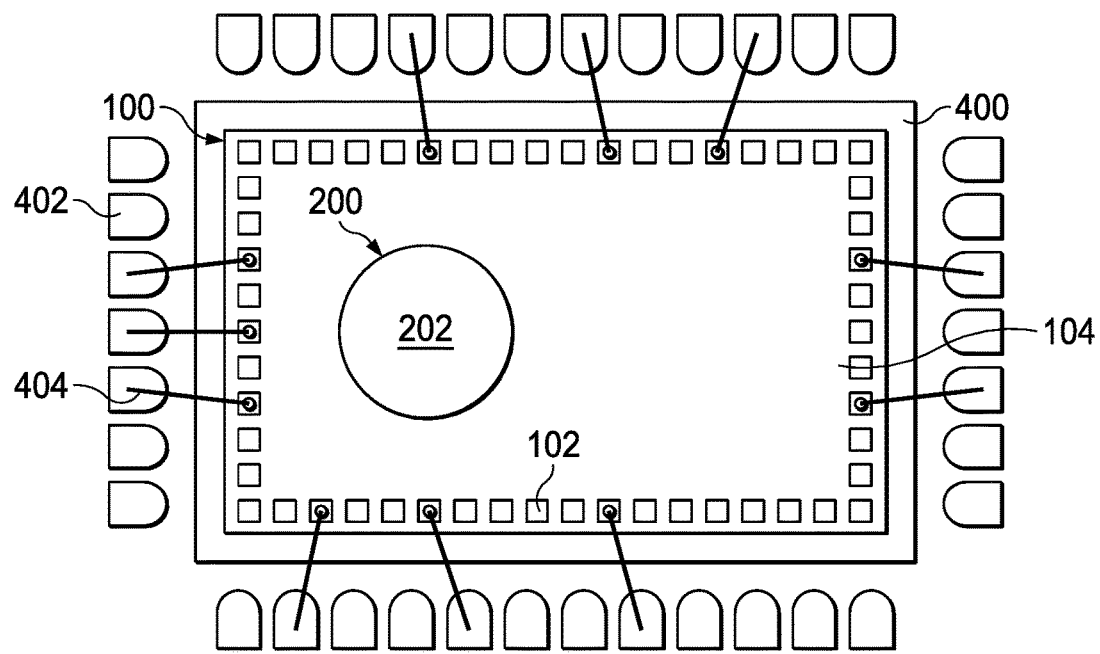

The method 900 includes positioning the semiconductor die, the polymer film member, and the solid member in a mold chase (906). However, prior to positioning these structures in a mold chase, the structure of FIG. 3A may be singulated from its semiconductor wafer and coupled to a die pad of a lead frame, and wirebonds may be applied to couple the bond pads to conductive terminals (e.g., leads) of a lead frame. For example, FIG. 4A is a perspective view of the semiconductor die 100 coupled to a die pad 400. Bond wires 404 are coupled between bond pads 102 and conductive terminals 402, for example using balls, wedge techniques, etc. FIG. 4B is a top-down view of the structure of FIG. 4A.

FIG. 5 is a profile view of the structure of FIG. 4A inside a mold chase. The mold chase includes top and bottom members. The bottom member is not illustrated, for clarity and simplicity. A top member 500 of the mold chase is lowered onto the solid member 202 such that the bottom surface of the top member 500 makes contact with the top surface of the solid member 202. As explained above, the polymer film member 204 is compressible, meaning that it may be compressed to accommodate the extent to which the top member 500 is lowered, while still maintaining contact between the solid member 202 and the top member 500, as shown. As mentioned, to achieve this behavior of the polymer film member 204 when the top member 500 is lowered, the compressibility of the polymer film member 204 may range from 10% to 50%. Further, because the solid member 202 maintains contact with the top member 500 due to the compressibility of the polymer film member 204, no additional films are needed between the top surface of the solid member 202 and the bottom surface of the top member 500.

The method 900 comprises covering the semiconductor die with a mold compound, the polymer film member precluding the mold compound from covering the sensor and the solid member precluding the mold compound from covering the polymer film member (908). Specifically, the mold compound is applied (e.g., injected) into the mold chase, between the top member 500 and the bottom member. The mold compound flows and covers the various components of the structure shown in FIG. 5, thereby producing a sensor package as shown in FIG. 6A. In examples, epoxies and plastics may be used. The stud 200 prevents mold compound from covering the sensor 106 and, at the same time, causes the formation of a sensor cavity.

Figure 6B:
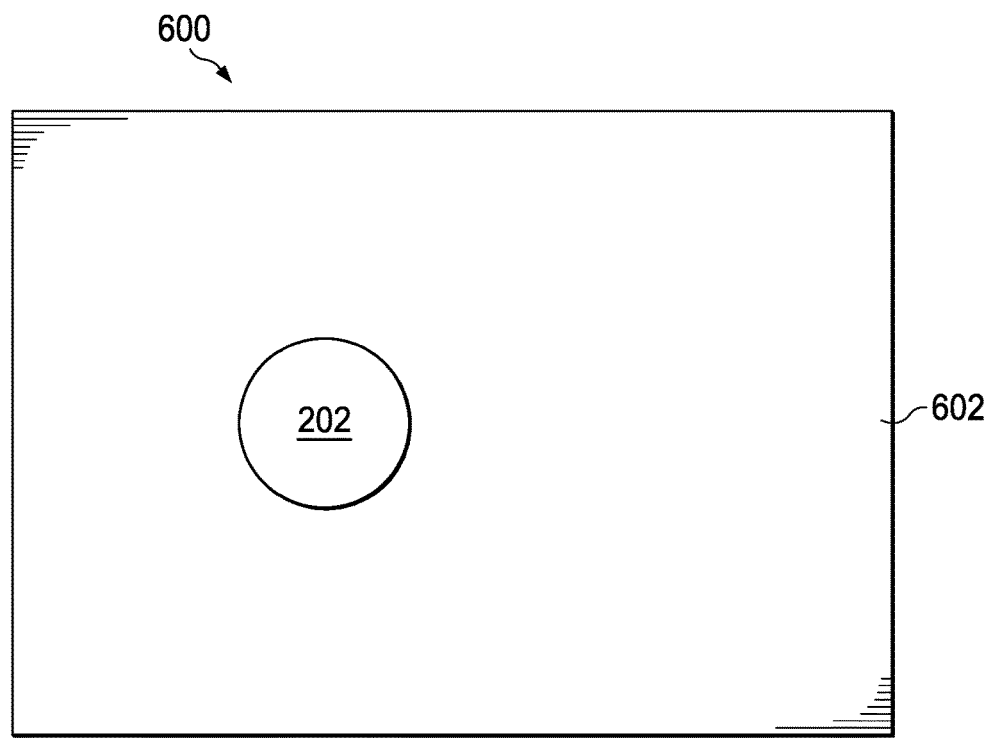
Figure 6C:
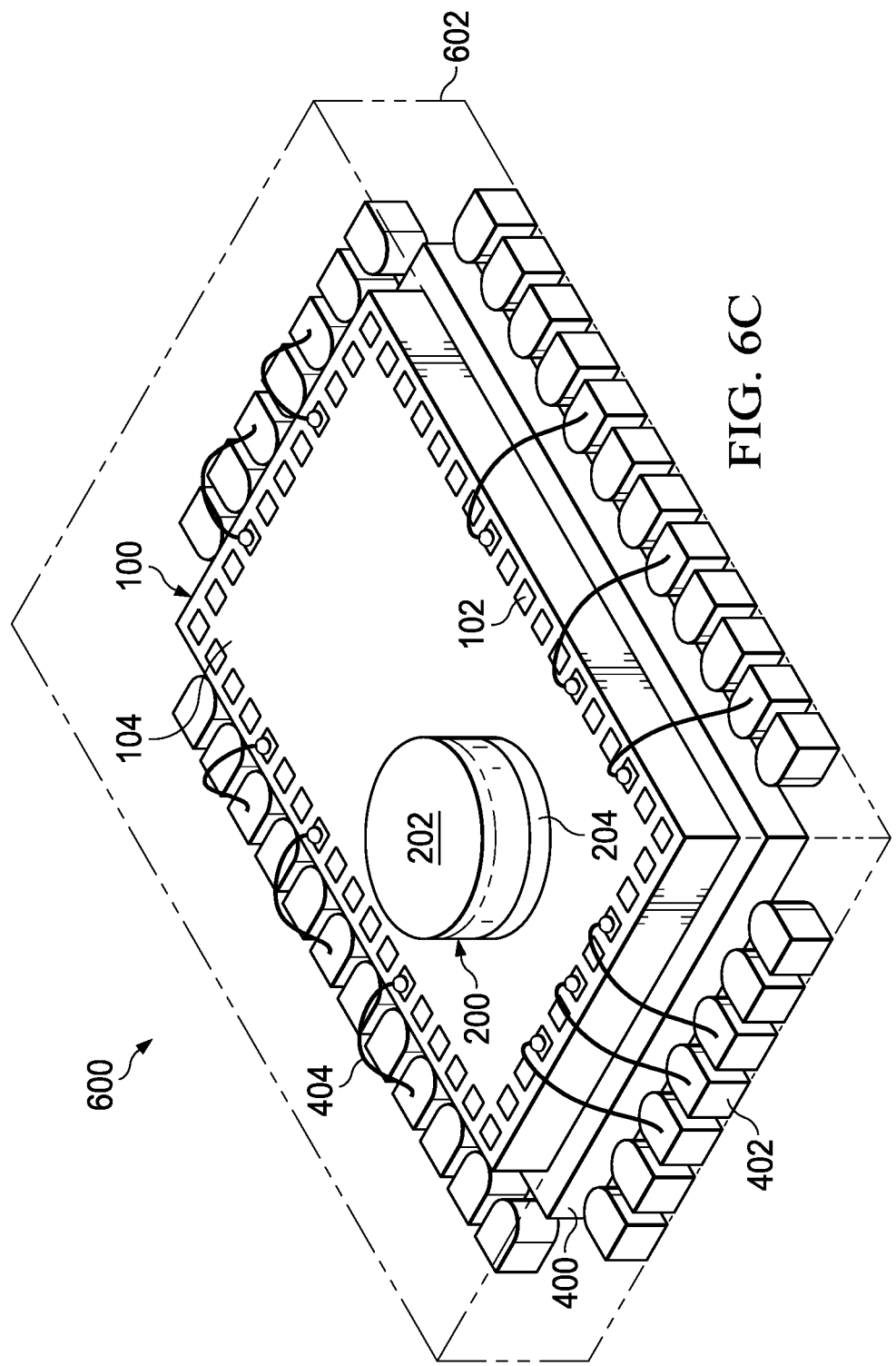

FIG. 6A is a perspective view of a sensor package 600 produced by applying a mold compound 602. Conductive terminals 402 are exposed to an exterior surface of the sensor package 600. The solid member 202 is also exposed to an exterior surface of the sensor package 600. Depending on the amount of mold compound applied, the top surface of the solid member 202 is flush with the exterior surface (e.g., the top surface) of the sensor package 600, or alternatively, the top surface of the solid member 202 is higher than (e.g., extends beyond) the exterior surface of the sensor package 600. FIG. 6B is a top-down view of the structure of FIG. 6A. FIG. 6C is a perspective, semi-transparent view of the contents of the sensor package 600.

The method 900 includes removing the solid member from the polymer film member to form a sensor cavity in the mold compound (910). Any suitable technique may be used to remove the solid member 202 from the polymer film member 204. In some examples, an etching technique (e.g., using nitric acid) is used, and in other examples, hydrochloric acid, sulfuric acid, isopropyl alcohol, toluene, xylene, hydroperoxide, etc. may be used. Removal of the solid member 202 produces a sensor cavity, and the polymer film member 204 is positioned at the bottom of this sensor cavity, exposed to an exterior environment of the sensor package 600. FIG. 7A is a perspective view of a completed sensor package 600 having a sensor cavity 700. As shown, the polymer film member 204 is at the bottom of the sensor cavity 700, covering the sensor 106 (not shown in FIG. 7A). In some examples, the thickness of the polymer film member 204 may be such that the polymer film member 204 occupies half or more of the volume of the sensor cavity 700. Stated another way, the thickness of the polymer film member 204 may exceed half the depth of the sensor cavity 700. A thicker polymer film member 204 may provide greater protection for the sensor 106 from deleterious environmental factors, such as physical trauma. In some examples, the diameter of the polymer film member 204 may equal a diameter of the sensor cavity 700. In such cases, a wall 702 of the sensor cavity 700 circumscribes the polymer film member 204. In other examples, the diameter of the polymer film member 204 may exceed a diameter of the sensor cavity, for example if the stud used has a polymer film member with a larger horizontal area than the horizontal area of the solid member (e.g., stud 218 in FIG. 2A). In such examples, because the horizontal area of the polymer film member 204 is larger than the area of the sensor cavity 700, the polymer film member 204 is locked into place by the mold compound 602.

Figure 7B:
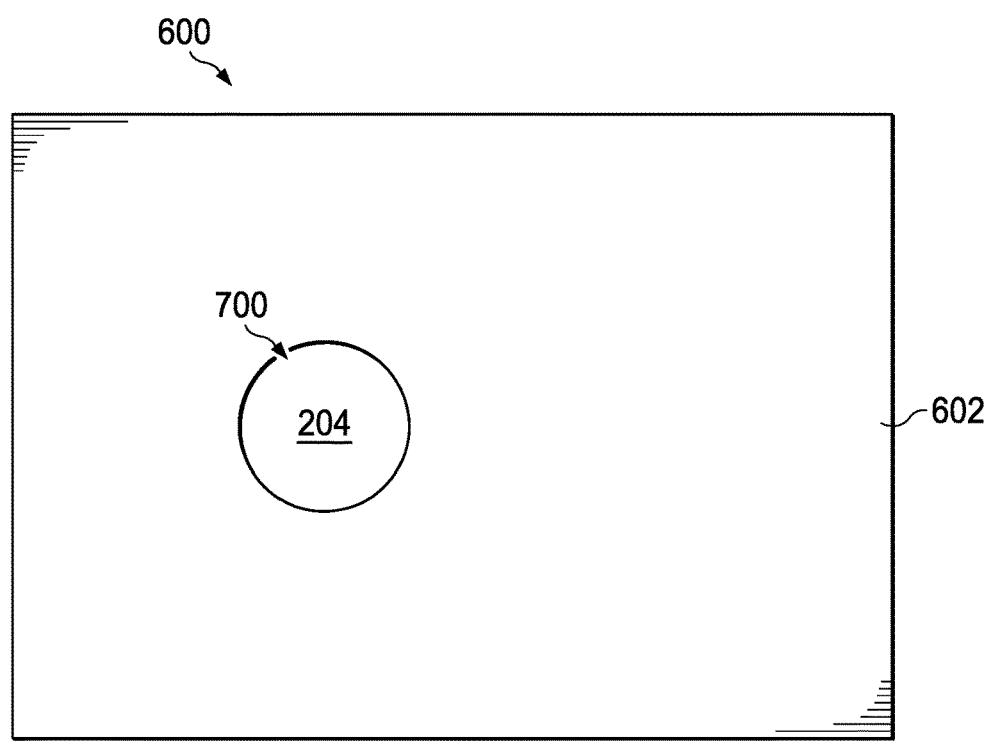
Figure 7C:
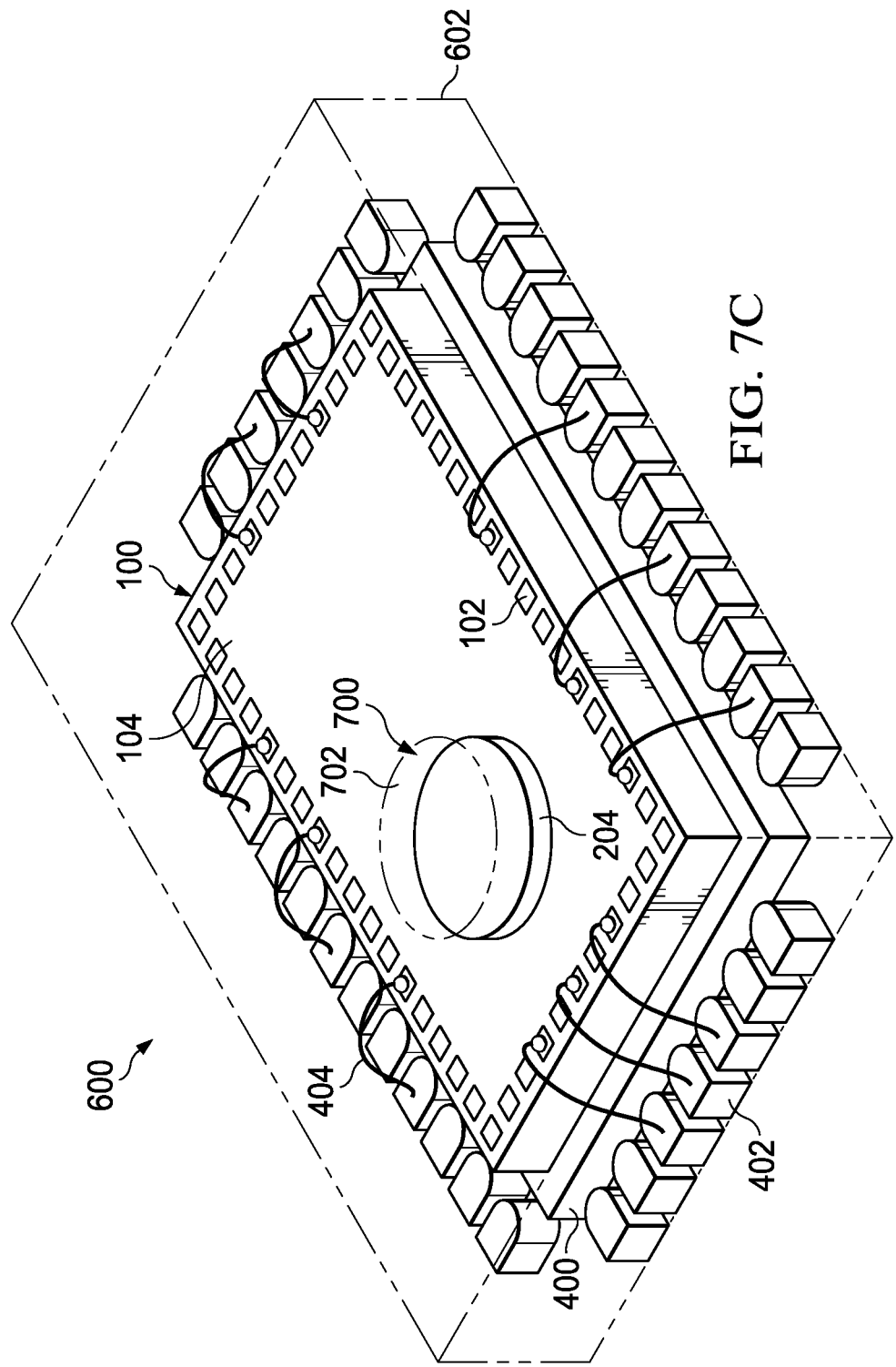

As explained in detail above, the studs (e.g., studs 200, 206, 212, 218) are manufactured separately from the semiconductor die 100 and from the sensor package 600. As a result, highly precise techniques may be used to manufacture the studs, resulting in small stud sizes. Such a small stud is then used to form the sensor cavity 700, as described above. Because the studs have small sizes, the sensor cavities (e.g., sensor cavity 700) formed using the studs also have small sizes. In some examples, the sensor cavity 700 has a diameter ranging from 50 microns to 2 mm (e.g., less than 100 microns) and a depth ranging from 50 microns to 500 microns. In the event that the sensor cavity 700 has a rectangular horizontal cross section, the sensor cavity 700 has a length ranging between 50 microns and 2 mm and/or a width ranging between 50 microns and 2 mm. Because the sensor cavity 700 is small compared to prior sensor cavities, the sensor package 600 is capable of accommodating multiple sensor cavities 700. Alternatively, because the sensor cavity 700 is small compared to prior sensor cavities, the sensor package 600 is FIG. 7B is a top-down view of the structure of FIG. 7A. FIG. 7C is a perspective, partially-transparent view of the structure of FIG. 7A.

Figure 8A:
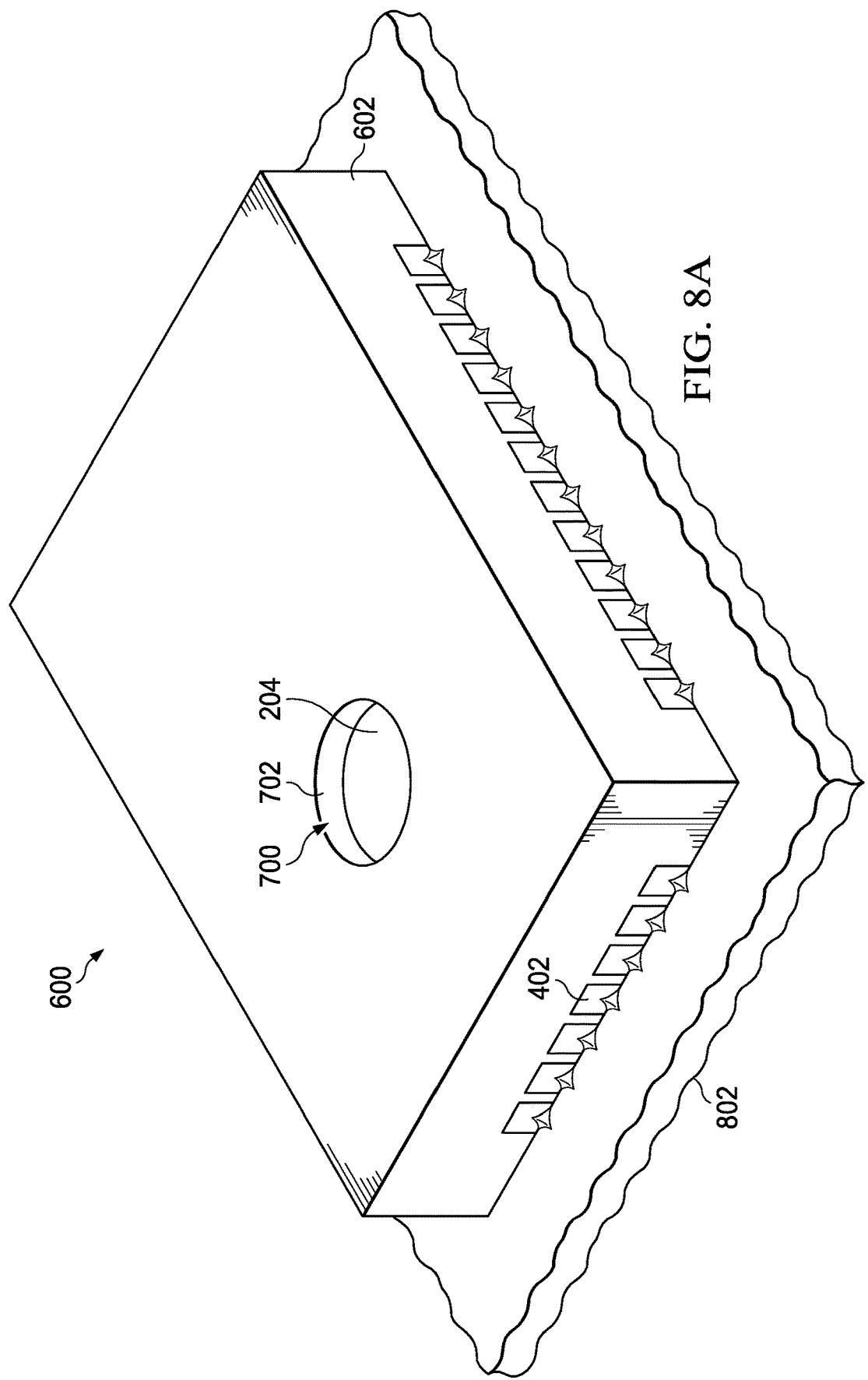

The sensor package 600 may be singulated from its lead frame and coupled to a printed circuit board (PCB). FIG. 8A is a perspective view of the sensor package 600 coupled to a PCB 802, for example, to interact with other circuitry on the PCB 802, such as a processor or microcontroller that may receive signals from the sensor 106. For instance, the polymer film member 204, which is exposed to an external environment of the sensor package 600, may be altered by such exposure. The sensor 106 detects such alterations and provides signals encoding such detections to the processor or microcontroller on the PCB 802, or, alternatively, to an analog front end (AFE) circuit in the sensor package 600 which then forwards the signals to the processor or microcontroller on the PCB 802. FIG. 8B is a top-down view of the structure of FIG. 8A.

In the foregoing discussion and in the claims, the terms "including" and "comprising" are used in an open-ended fashion, and thus mean "including, but not limited to . . . ." Also, the term "couple" or "couples" means either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is illustrative of the principles and various examples of the present disclosure. Numerous variations and modifications will become apparent to those skilled in the art once the above disclosure is fully appreciated. The following claims should be interpreted to embrace all such variations and modifications.

What is claimed is:

1. A method, comprising:
   covering a sensor of a semiconductor die with a polymer film member, the polymer film member coupled to a solid member;
   positioning the semiconductor die, the polymer film member, and the solid member in a mold chase;
   covering the semiconductor die with a mold compound, the polymer film member precluding the mold compound from covering the sensor and the solid member precluding the mold compound from covering the polymer film member; and
   removing the solid member from the polymer film member to form a sensor cavity in the mold compound.

2. The method of claim 1, wherein the polymer film member is taped to the solid member.

3. The method of claim 1, further comprising omitting a film from between the solid member and a member of a mold chase.

4. The method of claim 1, wherein the solid member comprises metal.

5. The method of claim 1, wherein removing the solid member from the polymer film member comprises etching the solid member.

6. The method of claim 1, wherein the polymer film member is circumscribed by a wall of the mold compound forming the sensor cavity.

7. The method of claim 1, wherein the polymer film member has a diameter that exceeds a diameter of the sensor cavity by a value between 0.1 millimeters and 2 millimeters.

8. The method of claim 1, wherein the polymer film member has a minimum compressibility of 5%.

9. The method of claim 1, wherein a diameter, length, or width of the sensor cavity is less than 100 microns.

10. The method of claim 1, wherein the polymer film member is non-photosensitive.

* * * * *